United States Patent
Schauwecker et al.

(10) Patent No.: US 6,307,370 B1
(45) Date of Patent: Oct. 23, 2001

(54) ACTIVE SHIELDED SUPERCONDUCTING ASSEMBLY WITH IMPROVED COMPENSATION OF MAGENTIC FIELD DISTURBANCES

(75) Inventors: Robert Schauwecker; Pierre-Alain Bovier, both of Zuerich; Daniel M. Eckert, Duebendorf, all of (CH)

(73) Assignee: Bruker AG, Faellanden (CH)

( * ) Notice: Subject to any disclaimer, the term of this patent is extended or adjusted under 35 U.S.C. 154(b) by 0 days.

(21) Appl. No.: 09/347,054

(22) Filed: Jul. 2, 1999

(30) Foreign Application Priority Data

Jul. 2, 1999 (DE) .............................................. 199 30 404

(51) Int. Cl.⁷ ...................................................... G01V 3/00
(52) U.S. Cl. ........................... 324/318; 324/309; 324/322
(58) Field of Search .................................. 324/318, 309, 324/301, 300, 322; 335/299; 361/141

(56) References Cited

U.S. PATENT DOCUMENTS

| | | |
|---|---|---|
| 4,926,289 | 5/1990 | Reichert . |
| 4,974,113 | 11/1990 | Gabrielse et al. . |
| 5,329,266 | 7/1994 | Soeldner et al. . |

Primary Examiner—Jay Patidar
Assistant Examiner—Brij B. Shrivastav

(57) ABSTRACT

A superconducting magnet arrangement with at least two current paths, short-circuited via switches in the operational state, which may carry different currents, wherein the magnet arrangement comprises at least one actively shielded superconducting magnet with a radially inner and a radially outer coil system which carry approximately the same current and have dipole moments of approximately the same magnitude, but opposite in direction, such that an outer magnetic field disturbance in a working volume of the magnet arrangement in the long-term behavior is suppressed to a remaining value of less than 20% of the external magnetic field disturbance, is characterized in that sections of the superconducting current paths are disturbance, is characterized in that sections of the superconducting current paths are bridged by ohmic resistors and that said sections and the ohmic resistors are chosen such that the magnetic field disturbance in the working volume is reduced already directly after its occurrence with respect to the field shift remaining after a long time, and that subsequently, the magnetic field disturbance in the working volume approaches the said field shift monotonously with a time constant of $\tau \geq 2$ sec. In this manner, also the short-term behavior of such a magnet system is improved in case an external disturbance occurs and new ways for optimizing the dynamic disturbance behavior are shown which require relatively little technical expense.

28 Claims, 5 Drawing Sheets

ACTIVE SHIELDED SUPERCONDUCTING ASSEMBLY WITH IMPROVED COMPENSATION OF MAGETIC FIELD DISTURBANCES

The invention relates to a superconducting magnet arrangement with at least two current paths, which are short-circuited during operation via superconducting switches, which can carry different currents, wherein the magnet arrangement comprises at least one actively shielded superconducting magnet having a radially inner and a radially outer coil system which carry approximately the same current and have dipole moments of approximately the same magnitude, but opposite in direction, such that an external magnetic field disturbance in a working volume is suppressed in the centre of the magnet arrangement in its long-term behavior to a remaining value of less than 20% of the external magnetic field disturbance.

Actively shielded superconducting magnet arrangements of this type are known e.g. from U.S. Pat. Nos. 5,329,266 or 4,926,289.

The field of use of superconducting magnets comprises various fields of application, in particular magnetic resonance methods, in which in general the stability with time of the magnetic field is important. One of the most demanding applications comprises high-resolution nuclear magnetic resonance spectroscopy (NMR spectroscopy). Field fluctuations with time may be caused by the superconducting magnet itself as well as by its surroundings. While it is possible with the current magnet and conductor technology to generate fields which are very stable with time, there is still the need for further development in the field of suppressing external magnetic disturbances. In the following, methods are shown about how these disturbances can be counteracted. The main focus lies in the field of compensating disturbances with superconducting solenoid magnets with active shielding of the stray field.

U.S. Pat. No. 4,974,113 describes i.a. a compensating, superconducting solenoid magnet, wherein there is no mention of any active shielding of the magnet system. The idea there consists in that at least two independent superconducting current paths are realized by means of two coaxially arranged superconducting solenoid coils and are calculated such that occurring external magnetic field disturbances are suppressed to at least 80% in the inside of the arrangement by taking into consideration the invariance of the entire magnetic flux through each current path with closed superconducting loop.

U.S. Pat. No. 5,329,266 describes an application of this idea to an actively shielded magnet system. It provides a plurality of shielding structured compensation coils which are connected in series in a superconducting manner and comprise each individually a current limiter with a maximum current which is small in relation to that of the main coils, in the range of a maximum of one ampere, to ensure that in case of a breakdown of the superconductivity (=Quench), the stray field generated by the magnet arrangement on the outside, remains as small as possible.

U.S. Pat. No. 4,926,289 shows an alternative approach, in which an actively shielded superconducting magnet system having a radially inner and a radially outer coil system which are connected in a superconducting manner, is described, wherein a superconducting short-circuit with a current limiter is provided between the inner and the outer coil system in order to keep the difference current in a reasonable range. Compensation of external disturbances is made possible in that the superconducting current limiter enables a shift of the current distribution between the radially inner and the radially outer superconducting current path between the two coil systems. In case of a Quench, the small current carrying capacity of the differential current limiter is to ensure that the external stray field generated by the magnet arrangement remains small.

The problem of compensation of external magnetic field disturbances with actively shielded magnet systems is thus solved by the above-described prior art either by means of one or several compensation coils provided in addition to the field coils or by dividing the coil system into superconductingly short-circuited sections, in such a manner that homogeneous outer magnetic field disturbances in the working volume of the respective magnet system are reduced to less than 20% in the long-term behavior.

In contrast thereto, it is the object of the present invention to improve also the short-term behavior of such a magnet system in case external disturbances occur and to demonstrate new approaches for optimizing the dynamic disturbance behavior which require as little technical expense as possible, in particular with respect to the equipment.

According to the invention, this object is achieved in that sections of the current paths short-circuited via superconducting switches are bridged via ohmic resistors and that said sections and the ohmic resistors are chosen so that the magnetic field disturbance in the working volume is reduced already immediately after its occurrence to a value smaller than the absolute remaining value in the long-term behavior of less than 20% of the external magnetic field disturbance, and that subsequently the magnetic field disturbance in the working volume approaches monotonously the remaining value of less than 20% of the external magnetic field disturbance with a time constant $\tau \geq 2$ sec, preferably $\tau \geq 5$ sec, in particular $\tau \approx 20$ sec.

By means of a finer division of the current paths into many sections, the short-term behavior of the compensation of disturbances is considerably improved as compared with known magnet systems. Furthermore, the bridging of sections of the superconducting current paths by means of resistors in most known magnets is already an integral component as protection against thermal damages in case of a quench. In order to optimize the disturbance behavior of real magnets, however, it is imperative that the influence of said resistors be taken into account. It is pointless to have a magnet compensating disturbances perfectly after a long time but massively overcompensating or undercompensating said disturbances directly after they occur.

Quite often field disturbances occur only sporadically and disappear again after a short time. With such disturbances the long-term behavior of the disturbance compensation has only little importance, however, the short-term behavior is important. Owing to its optimized short-term behavior, the inventive disturbance compensation has in exactly this case, considerable advantages with respect to prior art.

The inventive compensation of disturbances is particularly advantageous if it is operated together with an NMR lock. The NMR lock is an extremely accurate field stabilizer which is, unfortunately, very sluggish and thus cannot react to quick field disturbances. At this point the compensation of disturbances comes into action through its capability of compensating just these and thus presents an ideal supplement to the NM R lock.

The fact that the sections are not short-circuited in a superconducting manner, like it is partly the case in prior art, but with ohmic resistors, has the advantage that it is easier to realize technically. In the case of a magnet with e.g. 20 additional superconducting switches instead of resistors, much too much heat, e.g. during charging, if all switches are open, would be generated in the heaters. The quench behavior would also be a problem if e.g. only the shielding would quench, which would result in an excessive stray field, and the field drift of the magnet could be increased. Furthermore, one can expect large cost savings by using resistors instead of superconducting switches.

The above-mentioned advantages of the invention are useful in particular with sensitive systems. For this reason, in a preferred embodiment, the magnet arrangement according to the invention is part of an apparatus for high-resolution magnetic resonance spectroscopy, e.g. in the field of NMR, ICR or MRI.

NMR apparatus comprise normally a means for stabilizing the magnetic field generated in the working volume. This device utilizes a lock coil for correction as well as an NMR signal for the detection of the field disturbance and is called an NMR lock. However, it should be guaranteed that existing active devices for the compensation of magnetic field fluctuations, like e.g. said NMR lock do not interact with the interference suppression of the magnet according to the invention. For this reason, a further development of the above-mentioned embodiment is provided in which the superconducting current paths are largely decoupled from the lock coil. The advantage of the inductive decoupling of the superconducting current paths from the lock coil consists in that the effect of the NMR lock is not impeded by the magnet.

In case the field is to be modulated with sweep coils which is known per se from prior art, this modulation must not be compensated by the magnet like an external disturbance. In a further development of the invention the superconducting current paths are thus largely decoupled from the sweep coils. The advantage of the inductive decoupling of the superconducting current paths from the sweep coils consists in that the magnet is transparent for the sweep field.

In a preferred embodiment of the inventive magnet arrangement the ohmic resistors are arranged such that in case of a quench with possibly also a partial breakdown of the superconductivity in the magnet arrangement, they take on the function of protective resistors in order to protect the magnet arrangement from thermal and mechanical damage. The advantage of this embodiment consists in the double utilization of the coil division in sections bridged with resistors which, on the one hand act to protect the arrangement in case of a quench, but on the other hand simultaneously also serve to optimize the short-time response to external disturbances.

One embodiment of the invention is also preferred in which the sections, the ohmic resistors and the resistors of the open switches which are superconducting during operation, are dimensioned such that when applying a charging voltage to the magnet arrangement during the charging phase of the superconducting current paths, the current differences between neighbouring sections of the current paths are as small as possible.

During the charging of part of the magnet arrangement, a current flows also through the parallel resistors and the open switches, wherein "open" means resistive instead of superconduction. Additionally, transverse currents can also flow into the coil from the resistor sequence and vice versa. The advantage of the arrangement according to the above-mentioned embodiment consists in that the transverse currents are minimized, whereby the risk of a quench during charging at those points where the resistive wires are soldered to the superconductor, is reduced. Since the currents in the resistor sequence and thus also the transverse currents are proportional to the charging voltage, charging can be carried out at higher voltages, i.e. more quickly, under the conditions according to said embodiment.

With certain magnet arrangements it is not only necessary to generate a field which is highly constant with respect to time but also with respect to location. In case of external disturbances, problems with the local homogeneity may be generated not so much by inhomogeneity of the disturbing field itself but rather by a, possibly, inhomogeneous compensation field of the magnet arrangement. For this reason, an embodiment of the invention is preferred in which the sections and/or the ohmic resistors and the superconducting current paths are dimensioned in such a manner that in case of the occurrence of an external magnetic field disturbance, the homogeneity of the magnetic field generated by the magnet arrangement in the working volume will be essentially maintained. The advantage of this arrangement consists in that the current changes induced in the superconducting current paths through an external disturbance, as a whole build up a compensation field which does not reduce the basic homogeneity of the magnet.

In the following some concrete variations for the realization of the wiring of a magnet arrangement in accordance with the invention will be described:

An advantageous embodiment is characterized in that the radially inner coil system is connected in series with the radially outer coil system of the actively shielded magnet, wherein said serial connection forms a first current path which is superconductingly short-circuited during operation, and that a compensation coil which is galvanically not connected or at the most once and not multiply connected with the two coil systems, is arranged coaxially with respect to the two coil systems and forms a further current path which is superconductingly short-circuited during operation. This embodiment contains a simple realistic solution with merely two current paths with closed superconducting loop of which only one is provided with sections and resistors of the type mentioned above. I.e. only one single superconducting current path is provided in addition to the superconducting path of the main field magnet.

A further simple solution in which no additional coils are required consists in that the radially inner coil system is connected in series with the radially outer coil system of the actively shielded magnet, wherein said connection in series forms a first current path which is superconductingly short-circuited during operation, and that part of the inner and/or the outer coil system of the actively shielded magnet can be short-circuited via a further superconducting switch and thus forms a further current path which is superconductingly short-circuited during operation.

A further advantageous embodiment in which at least some of the current paths which are superconductingly short-circuited during operation, are connected in series in a superconducting manner offers, in contrast thereto, still further flexibility for optimizing the disturbance behavior of the magnet arrangement.

In case different superconducting current paths are wound e.g. on different magnet sections, it is easier to connect them only resistively. By means of the resistive connection, common charging is made possible. For this reason, one embodiment is advantageous in which at least two parts of the current paths which are superconductingly short-circuited during operation, are resistively connected to each other and that each of the current paths comprises at least one superconducting switch.

In a further embodiment, in which at least one part of the current paths which are superconductingly short-circuited during operation, is not connected galvanically with the rest, this is solved in a different manner, which again results in more flexibility for optimizing the disturbance behavior of the arrangement. In this manner, e.g. also a superconducting shim system is included.

A preferred further development of the above-mentioned embodiments provides that at least at some points where after charging of the superconducting magnet arrangement, no current flows in the initial state of operation, current limiters, preferably for maximum currents of a few amperes and/or small ohmic resistors, preferably in the order of $\mu\Omega$ to $m\Omega$ are inserted in the otherwise superconducting current paths. In this manner, long-term effects can be effectively suppressed and problems like e.g. stray field increase during quenching can be eliminated or at least considerably reduced.

During the charging of parts of the magnet arrangement, it might be possible that several of the superconductingly short-circuited paths must be supplied with current, i.e. their switches must be heated simultaneously. In other superconductingly short-circuited current paths, e.g. compensation coils, shims etc. a possibly induced current has to be reduced on a permanent basis via the switch, for which reason also the switches of said current paths have to be heated. For this reason, a further development of the inventive magnet arrangement is preferred in which at least one superconducting switch comprises a heating element which is electrically connected in series with the heaters of the superconducting switch of at least one further current path. The advantage of this arrangement consists in that by connecting switch heaters in series, the number of heater current leads in the current rod can be reduced and the handling of the magnet arrangement becomes easier and safer.

In a further preferred embodiment the heaters of at least one superconducting switch can be heated via the serial connection with another switch heater and also separately. In this way, it is possible to utilize advantages of the serial connection of the heaters, like e.g. simple handling, but nevertheless it is possible to charge the superconducting current paths individually with an additionally separately heatable switch.

A particularly preferred embodiment of the inventive magnet arrangement is characterized in that the current paths which are superconductingly short-circuited during operation are at least largely inductively decoupled from one another. During charging thus no currents are mutually induced which would generate a great amount of heat through the open switches. Moreover, there is no mutual influence of drifting superconducting current paths, which could lead e.g. to steady charging of a coil. In case of a quench of a superconducting current path, e.g. of the magnet, another current path, e.g. a compensation coil, will generate gradually a higher stray field. A compensation coil decoupled from the magnet may also be used as HO-shim, if it generates a field of sufficient homogeneity.

In a preferred further development of this embodiment, one utilizes a different polarity of the radially inner and the radially outer coil system of the actively shielded magnet for the inductive decoupling. The utilization of the different polarities of stray field shielding and main coil facilitates the design of magnet arrangements according to the above-described embodiment.

If e.g. compensation coils are distributed to different radii or provided with notch structures, one obtains additional flexibility in order to fulfil conditions like decoupling from the magnet, maintenance of the field homogeneity during disturbances and optimum disturbance compensation. For this reason, an embodiment of the inventive magnet arrangement is advantageous in which one or several of the current paths with closed superconducting loop comprise coils with different winding radii and/or different current densities, wherein said coils are coaxial with the actively shielded magnet.

The inventive concept provides also higher accuracy than e.g. the accuracy of the above-mentioned U.S. Pat. No. 4,974,113 of more than 20% in disturbance compensation by simple means. For this reason, an embodiment of the invention is particularly advantageous in which the sections and ohmic resistors are chosen such that through the entire time period compensation of the external magnetic field disturbance in the working volume is effected to a remaining value of less than 10%, preferably less than 5%, particularly preferred of less than 2%.

Furthermore, the inventive measures also serve to suppress or at least significantly reduce inhomogeneous disturbances of the magnetic field in the working volume of the magnet arrangement in addition to the homogeneous parts of the magnetic field disturbances.

A method of calculating and optimizing a magnet arrangement of the above-described inventive type is also within the scope of the present invention and is characterized in that the time evolution of the field strength of the magnetic field generated in the working volume is calculated after a sudden external magnetic field disturbance and is optimized through variation of the arrangement of the sections bridged by ohmic resistors, the ohmic resistors and the geometric arrangement of the current paths which are superconductingly short-circuited during operation.

In contrast to the known methods for the determination of the behavior of a magnet arrangement under the influence of external disturbances, it is not only possible with the inventive method to optimize the long-term behavior but also the entire time behavior of a magnet arrangement. This is important in case the magnet arrangement comprises not only infinite time constants, when only current paths with closed superconducting loops exist, but also finite time constants if there are also resistively bridged sections of the current paths with closed superconducting loops. In particular, the compensation of disturbances of the magnet arrangement can be optimized instantly and shortly after the disturbance.

In an advantageous further development of the inventive method also the time evolution of the second derivative of the magnetic field strength with respect to the coordinate of the field direction in the working volume is used with the aim of minimizing its change with time after a sudden external magnetic field disturbance. This brings about the same advantages as in the above-described method, however, applied to $d^2B/dz^2|_{z=0}(t)$ instead of $B(t)$.

Further advantages of the invention can be gathered from the description and the drawing. The features mentioned above and below can be applied according to the invention individually or in any arbitrary combination. The embodiments shown and described are not to be taken as exhaustive enumeration but rather have exemplary character for describing the invention.

The invention is shown in the drawing and is further explained by means of embodiments. In the drawing.

Figure 3:
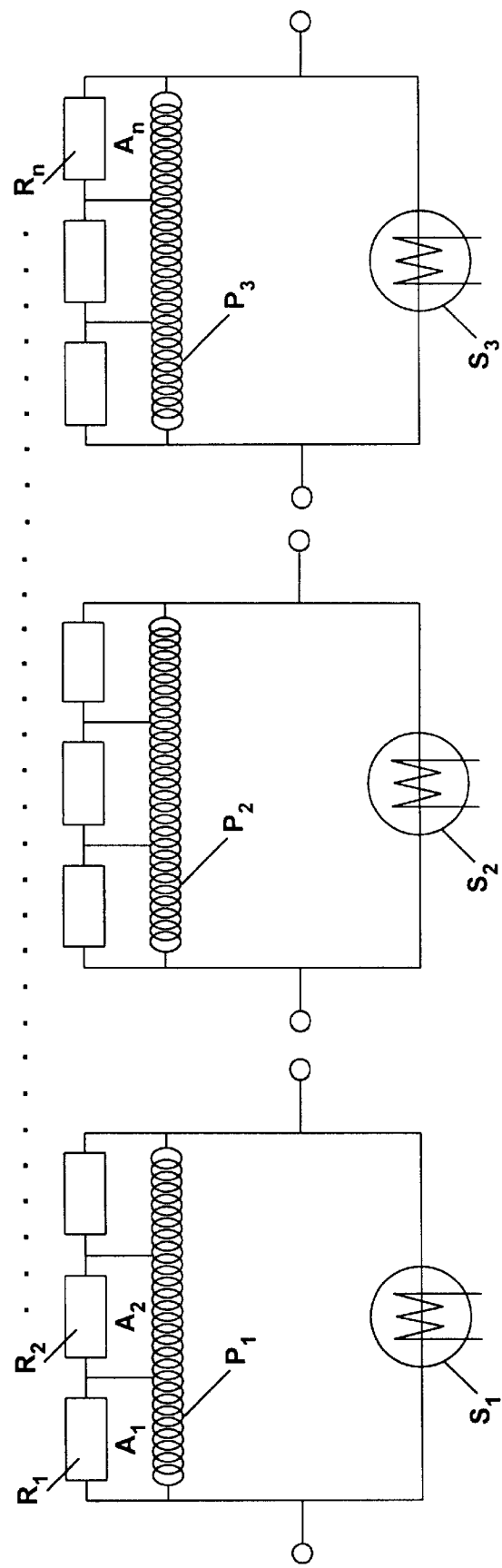
Figure 4:
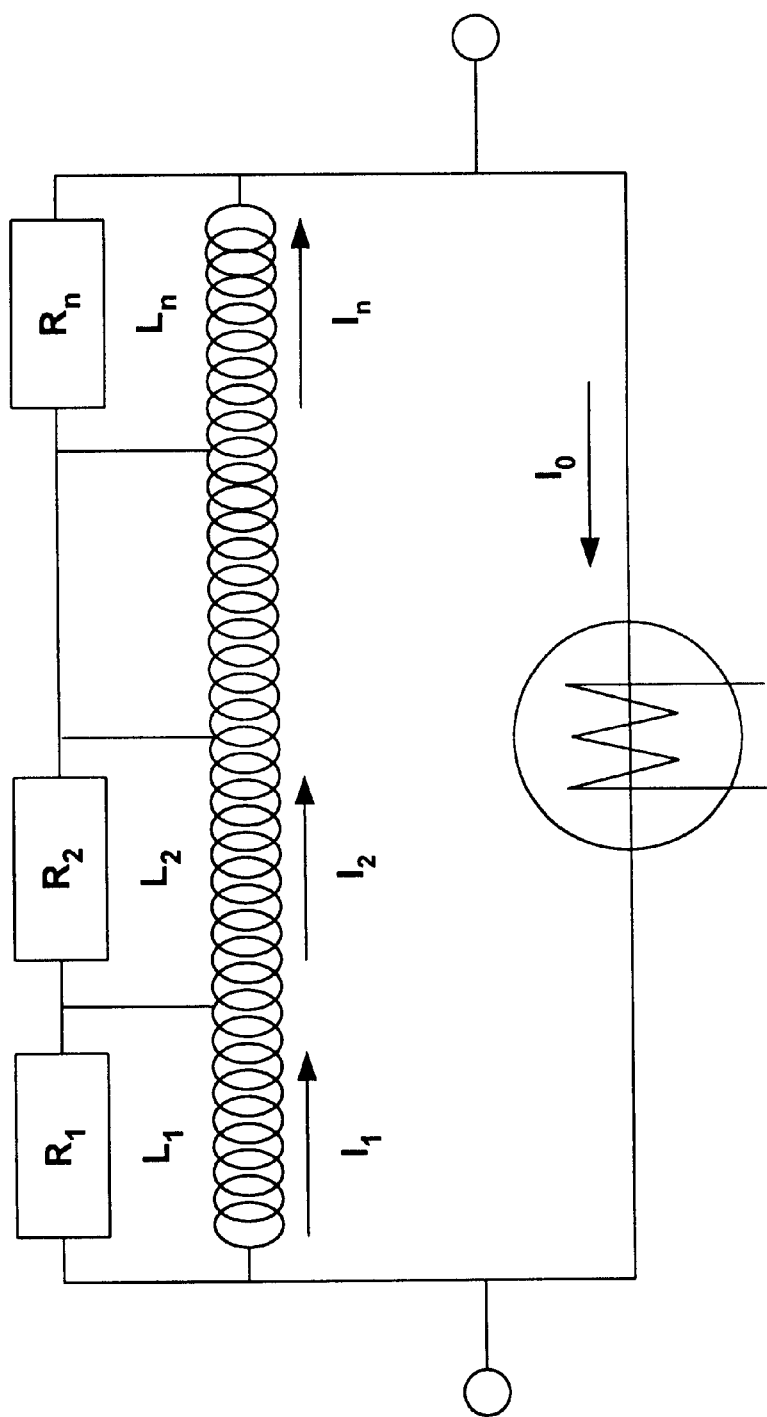
Figure 5:
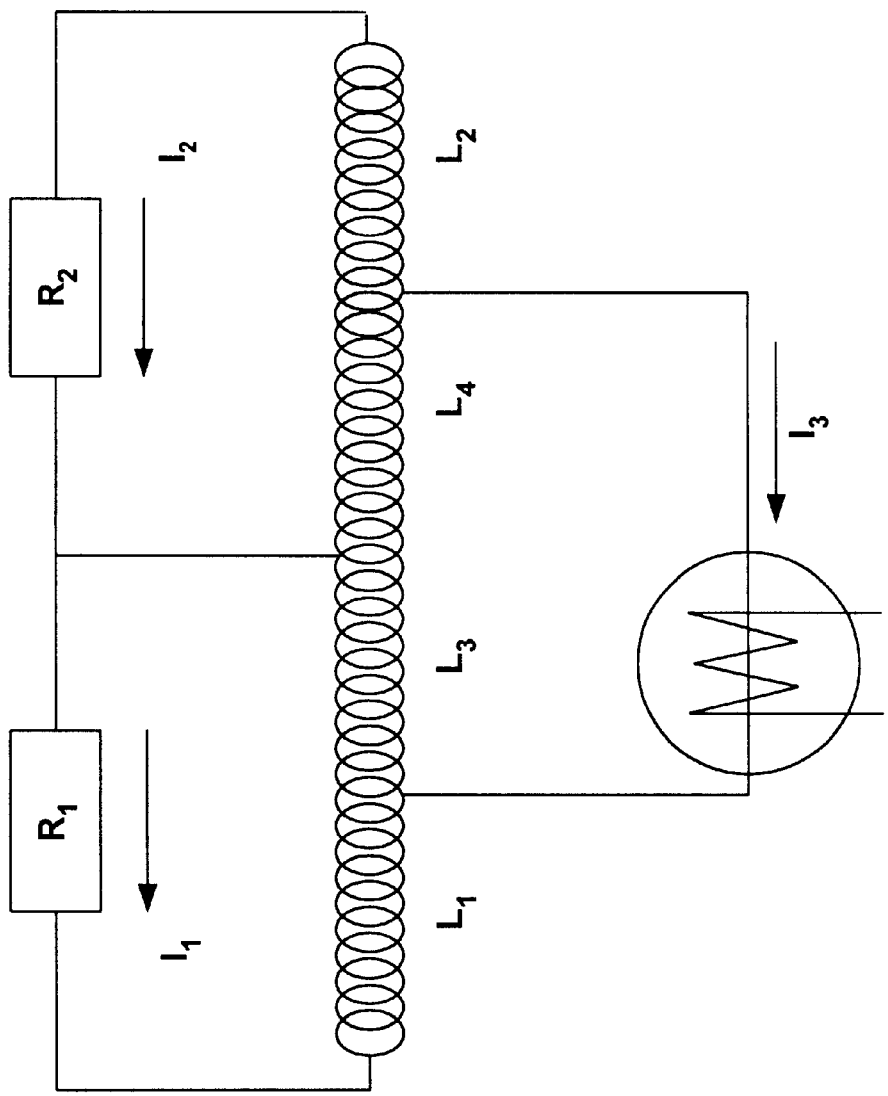

FIG. 3 a third embodiment, without galvanic connection, of the closed superconducting current paths;

FIG. 4 a wiring diagram of a superconducting magnet coil, divided into sections, comprising protective resistors; and FIG. 5 a hypothetical circuit for the explanation of the calculation method.

FIGS. 4 and 5 show hypothetical circuits for superconducting magnet arrangements which do not represent the present invention but rather serve for explaining the following calculation method.

A superconducting magnet arrangement generally consists of coil systems. These may be divided into sections which are protected by resistors. A schematic representation of this situation is shown in FIG. 4. The protective resistors $R_i (i=1, \ldots, n)$ are adapted to the coils in such a manner that during the charging the differential currents between the sections are as small as possible. This is achieved with the following condition:

$R_i$ proportinal to $$\sum_{j=1}^{n} L_{ij} \quad i = 1, \ldots, n$$

wherein $L_{ij}$ are the entries of the inductance matrix.

The mesh law enables calculation of the resistor currents from the others:

$$I_{Ri} = I_0 - I_i \text{ for } i=1, \ldots n \quad (1)$$

During operation the voltage over the entire circuit equals 0:

$$0 = \sum_{i=1}^{n} I_{Ri} R_i \stackrel{(1)}{=} I_0 \sum_{i=1}^{n} R_i - \sum_{i=1}^{n} I_i R_i \quad (2)$$

We now introduce the following abbreviations:

$$R_{tot} = \sum_{i=1}^{n} R_i, s_i = \frac{R_i}{R_{tot}}$$

From (2), it follows that:

$$I_0 = \sum_{i=1}^{n} s_i I_i \quad (3)$$

The only unknown currents are according to (1) and (3) only $I_1, \ldots, I_n$.

An external disturbance induces a voltage $U_j$ over each coil $L_j$. Its calculation will be carried out later. By taking into consideration the mutual inductivities we find the following voltage balance for the circuit No. j:

$$U_j - \sum_{i=1}^{n} L_{ij} \frac{dI_i}{dt} - I_{Rj} R_j = 0 \quad (4)$$

Through insertion of (1) and (3) at this point, the following results:

$$U_j - \sum_{i=1}^{n} L_{ij} \frac{dI_i}{dt} - \left(\sum_{i=1}^{n} s_i I_i - I_j\right) R_j = 0 \text{ for } j = 1, \ldots, n$$

This differential equation system can be written in matrix form as follows:

$$L \frac{dI}{dt} = -RI + U \quad (5)$$

with the inductance matrix L, the current vector $$I = \begin{pmatrix} I_1 \\ \vdots \\ I_n \end{pmatrix}$$

the voltage vector $$U = \begin{pmatrix} U_1 \\ \vdots \\ U_n \end{pmatrix}$$

and the resistance matrix $$R = \begin{pmatrix} R_1 & 0 & \cdots & 0 \\ 0 & R_2 & \cdots & 0 \\ \vdots & \vdots & \ddots & \vdots \\ 0 & 0 & \cdots & R_n \end{pmatrix} - \begin{pmatrix} R_1 s_1 & \cdots & R_1 s_n \\ \vdots & \ddots & \vdots \\ R_1 s_1 & \cdots & R_n s_n \end{pmatrix}$$

These considerations can be generalized for more complicated coil arrangements with or without protective resistors. In particular, we can include galvanically not connected coils or superconducting short-circuits. In general, it is possible to reduce at first the number of currents to the independent circuits by means of the mesh law (see(1)). Subsequently, a voltage balance can be established in each loop (see (2) and (4)). At the end one always gets an equation of type (5), wherein L is an inductance matrix and R a resistance matrix, I a current vector and U a voltage vector. In order to illustrate this situation, in the following these magnitudes are given for the hypothetical circuit of FIG. 5:

$$L = \begin{pmatrix} L_1 + L_3 + 2L_{13} & L_{12} + L_{14} + L_{34} + L_{23} & L_{13} + L_{14} + L_{34} + L_3 \\ L_{12} + L_{14} + L_{34} + L_{23} & L_2 + L_4 + 2L_{24} & L_{24} + L_{23} + L_{34} + L_4 \\ L_{13} + L_{14} + L_{34} + L_3 & L_{24} + L_{23} + L_{34} + L_4 & L_3 + L_4 + 2L_{24} \end{pmatrix}$$

$$R = \begin{pmatrix} R_1 & 0 & 0 \\ 0 & R_2 & 0 \\ 0 & 0 & 0 \end{pmatrix}; I = \begin{pmatrix} I_1 \\ I_2 \\ I_3 \end{pmatrix}; U = \begin{pmatrix} U_1 + U_3 \\ U_2 + U_4 \\ U_3 + U_4 \end{pmatrix}$$

In the following, the time evolution of the currents will be calculated for U=0 and an initial current distribution $I(t=0) = \Delta I_0$. We will now show that the equation system (5) can be solved exactly for this case. To do so, we define the new matrix $C = -L^{-1} R$ Thus, $$\frac{dI}{dt} = CI \quad (6)$$

has to be solved.

The matrix C has to be diagonalized. It is possible to find a (usually not orthogonal) transformation O with standard methods, such that $$O^{-1}CO = \text{diag}(-1/\tau_1, \ldots, -1/\tau_n)$$

is a diagonal matrix (all $\tau_i$ are >0). In the eigenbasis $$I' = O^{-1}I$$

(6) can be written as $$\frac{dI'}{dt} = diag(-1/\tau_1, \ldots, -1/\tau_n)I'$$

This gives n decoupled differential equations $$\frac{dI'_i}{dt} = -\frac{I'_i}{\tau_i}$$

With the initial condition $I'(t=0)=O^{-1}\Delta I_0$, the solution is $$I'_i(t) = I'_i(0)e^{-t/\tau_i}$$

The physical currents are obtained with the inverse transformation:

$$I(t) = OI'(t) \quad (7)$$

It is to be noted that a certain number of time constants $\tau_i$ are infinite, as many as the number of independent superconducting current paths.

The solution (7) of the differential equation system (5) is now to be applied to the case in which the initial current distribution $I(t=0)=\Delta I_o$ was induced by an external magnetic field disturbance in the coil sections. To simplify matters we only consider the case of a step disturbance at the time $t=0$ (i.e. the disturbance appears at $t=0$ and remains unchanged at later times). Since each disturbance is a superposition of such elementary disturbances, it is sufficient to optimize the disturbance behavior of our coil arrangement for such disturbances. Furthermore, we want to assume that our magnet system is balanced before the disturbance, i.e. no currents flow through the resistors. It is irrelevant for the disturbance behavior which currents flow in the superconducting parts. For this reason, they are set to zero.

According to the induction law, the voltages $U_i$ induced by the cause of the disturbance are given by $$U_i = -\frac{d\Phi_i}{dt}$$

wherein $\Phi_i$ characterizes the magnetic flux of the disturbance through the coil i:

$$\Phi_i = \int_i B_z(r, z, \varphi) dA$$

Here $B_z(r,z,\Phi)$ is the z component of the disturbance in the magnet volume.

To simplify matters, we omit the index i and write in vector notation $$U = -\frac{d\Phi}{dt}$$

As mentioned in the previous paragraph, we want to limit this to step disturbances, i.e.

$$B_z(t) = \Delta B_z \cdot \theta(t)$$

wherein $\theta(t)$ designates the step function. Then, $U=-\Delta\Phi\delta(t)$ is obtained with the components $$\Delta\Phi_i = \int_i \Delta B_z(r, z, \varphi) dA$$

According to the differential equation (5) the currents become discontinuous at $t=0$ and change by the amount $$\Delta I_0 = -L^{-1}\Delta\Phi \quad (8)$$

From (8) one can gather that the value of the protective resistors is irrelevant for the short-term behavior. The division of the coil into suitable sections is however highly important for the instantaneous response to magnetic disturbances.

As a measure of the sensitivity of a magnet we define the beta factor $\beta$ as the ratio of the resulting Bz field change in the magnetic centre (=superposition of the Bz component of the disturbance and of the compensation field generated by the magnet) to the Bz component of the disturbance alone. The beta factor describes the capacity of a magnet to compensate external disturbances in the magnetic centre. If e.g. $\beta=0$, no disturbance is visible in the magnetic centre. $\beta>0$ means that the induction currents compensate the disturbance insufficiently. $\beta<0$ means however, that the induction currents are that large that the disturbance in the magnet centre is over-compensated.

If $\Delta B_z$ designates the z component of the disturbance field in the magnetic centre (without compensation currents of the magnet) and b is the vector of the magnetic fields of each section (magnetic field per ampere current in the magnetic centre), the beta factor is as follows:

$$\beta(t) = 1 + \frac{b \cdot \Delta I(t)}{\Delta B_z},$$

wherein $\Delta I(t)$ is the solution (7) of the differential equation (5) with the initial values $\Delta I_0$ according to equation (8).

The dot in the numerator means the scalar product of the two vectors. This is the so-called dynamic beta factor.

We now define the "effective surface" of each closed circuit as $$A_i = \frac{\Delta \Phi_i}{\Delta B_z}$$

In case of a homogeneous disturbance, this is simply the area surrounded by the conductor.

In case of a step disturbance, the magnet will react immediately with the instantaneous beta factor $$\beta_0 = 1 + \frac{b \cdot \Delta I_0}{\Delta B_z} \stackrel{(8)}{=} 1 - \frac{b \cdot (L^{-1} \Delta \Phi)}{\Delta B_z} = 1 - b \cdot (L^{-1} A)$$

The value of $\beta_0$ depends on the respective coil division. In general one can note that a division into many sections makes the disturbance compensation almost ideal ($\beta_0 \approx 0$). This is also true for magnets with active stray field suppression if the shielding coil comprises one or several separate sections. The good instantaneous disturbance compensation of magnets with more than one section is almost insensitive to production tolerances and to the inhomogeneity of the disturbance.

If the magnet is balanced before a disturbance occurs (i.e. no currents flow through the protective resistors) and if the disturbance stays constant with time, the magnet gets stable after a sufficient time period (there is no further current flow in the protective resistors). The part of the disturbance still present in the magnetic centre is called the asymptotic beta factor $\beta\infty$. The latter can be optimized e.g. by allowing several superconducting current paths.

The dynamic beta factor forms the transition between instantaneous and asymptotic beta factors. It is important that the transition between $\beta_0$ and $\beta\infty$ is monotonous. This is not guaranteed automatically.

The behavior of a magnet arrangement of n sections $A_1$, ... $A_n$, which are bridged in a resistive or superconducting manner, can be described briefly as follows: We consider a disturbance in the form of a step function of the external field. The answer of the system to the disturbance can be divided into three phases:

1. the moment directly after the disturbance: The system behaves like n electrically independent superconducting circuits with $R_i=0$, which influence each other only via the mutual inductive coupling. The ($\beta$ factor of the system at this point in time is called the instantaneous $\beta$ factor $\beta_0$.
2. the dissipation phase: Directly after the disturbance, different currents $I_i$ flow in the various sections. In general, currents flow also through the bridging resistors and are dissipated there with the time constants $\tau_i$ which are characteristic for said sections. The time constants with which these currents relax in the resistors after the disturbance, correspond roughly to the ratio of inductance to resistance. They are at the most several 10 seconds. In the basis which renders the matrix $L^{-1}$. R diagonal, the time constants are the inverse eigenvalues of the diagonalized matrix. The $\beta$ factor of the system during this phase is called the dynamic $\beta$ factor $\beta(t)$.
3. The long-term behavior: After a long enough time, the currents through the resistors have decayed and a stationary current flows again in all sections. The $\beta$ factor of the system in this time period is called the long-term $\beta$ factor $\beta\infty$.

The disturbance behavior of magnets is fully described by the $\beta$ factors $\beta_0$, $\beta(t)$ and $\beta\infty$ as well as by the time constant $\tau_i$. All of these parameters can be optimized in the design.

Since $\beta\infty$ cannot be brought to zero for all disturbances, it is important to render the time constants as large as possible. For most applications $\beta_0$ and the time constants are the important parameters for a good behavior with respect to external disturbances.

In order to preserve a good homogeneity of the magnetic field in the working volume, it is less the homogeneity of the disturbance that counts than the homogeneity of the compensation field of the magnet. In the following we will consider only the case of an axially symmetrical coil arrangement, therefore the compensation field in the working volume (assuming the working volume is on the axis of symmetry) comprises only field gradients in the direction z of the axis of symmetry. A measure for the homogeneity are the derivatives (gradients):

$$H^k = \left. \frac{d^k B}{dz^k} \right|_{z=0}.$$

Let the magnet arrangement be, as described above, divided in n sections which react with individual current changes to a disturbance (vector of the current changes $\Delta I(t)$). If now $h^k$ is the vector of the gradient $H^k_i$ generated by the sections per ampere, the condition for the permanent preservation of homogeneity is $h^k \cdot \Delta I(t)=0$ for all k and t. Instantaneously the condition $h^k \cdot (L^{-1} \Delta \Phi)=0$ must be met for all k, which means $h^k \cdot (L^{-1} A) \cdot \Delta B_z=0$ for a homogeneous disturbance. In case of an arrangement which is symmetrical about the centre plane, only the hk with even k are not equal to zero. Owing to the usual coil geometries normally only the second order $h^2$ is relevant.

In case of several superconducting current paths, it is desirable to inductively decouple same from each other. Mainly with actively shielded magnets this could otherwise lead to an increase of the stray fields if the magnet drifts or if the main switch opens and the magnet decharges slowly. In case decoupling is not possible, either a small resistance or a current limiter is to be built into the additional superconducting current paths.

It is to be recommended that the heaters of the switches of the additional superconducting current paths be connected in series with the main switch heater of the magnet. In this manner it is guaranteed that during charging and decharging of the magnet with open main switch, the other switches are also open. Possibly remaining couplings between additional superconducting current paths and magnet thus cannot in this manner lead to a charging of said paths.

For test purposes it would be advisable to be able to operate the heaters of the switches of the additional superconducting paths separately. In this way, it is possible to e.g. experimentally determine the couplings of the various paths or introduce various currents into the different paths.

In order to enable the resistors, by means of which the sections of the superconducting current paths of the magnet arrangement are bridged, to exert a protective function also in the case of a quench, the sections and the resistors should meet various conditions:

The sections must not be too big in order to make sure that the voltage in the quenched section does not become too large;

The values of the resistors must not be too large, so that the current can flow out of the quenched sections via the resistor.

During charging only small transverse currents should flow from the resistor sequence into the coil since otherwise the risk of a quench would be increased. This is achieved by adjusting the inductive and resistive voltage divider as explained according to FIG. 1 and the associated calculations.

Figure 1:
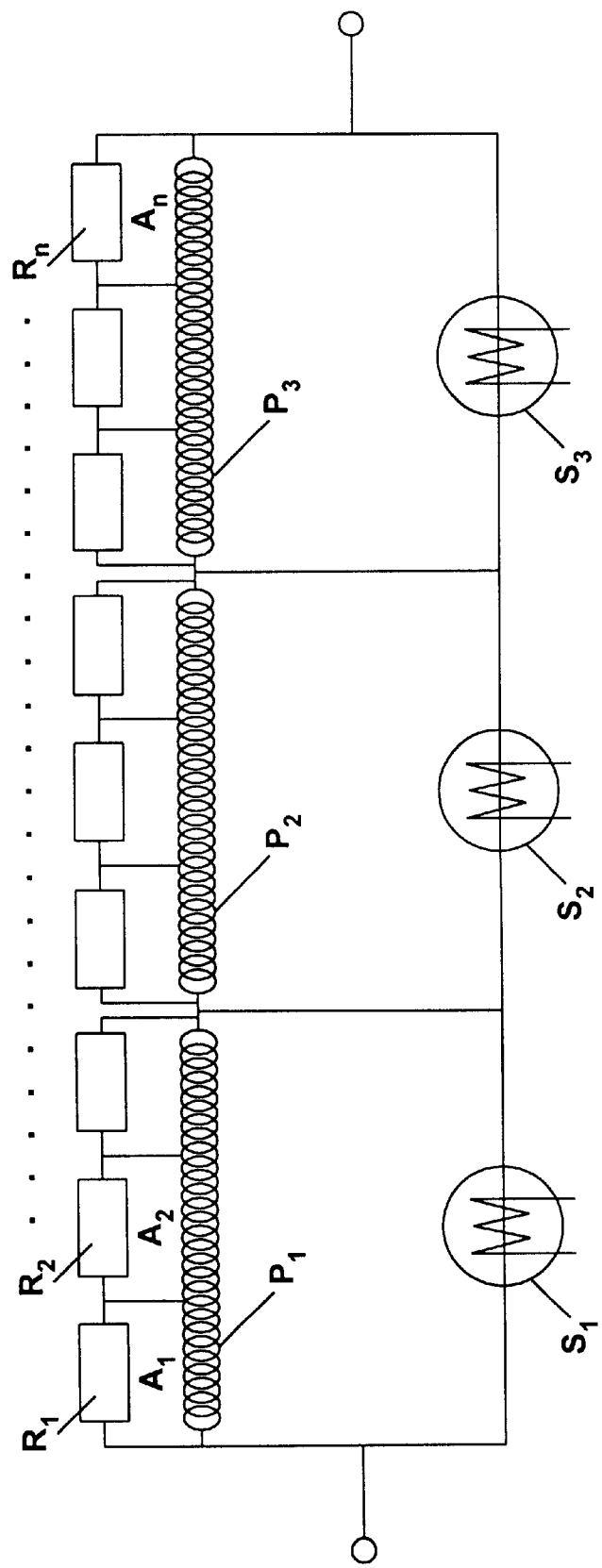
FIG. 1 shows a wiring diagram of a first embodiment of the magnet arrangement according to the invention with superconducting connections of the closed superconducting current paths.
Figure 2:
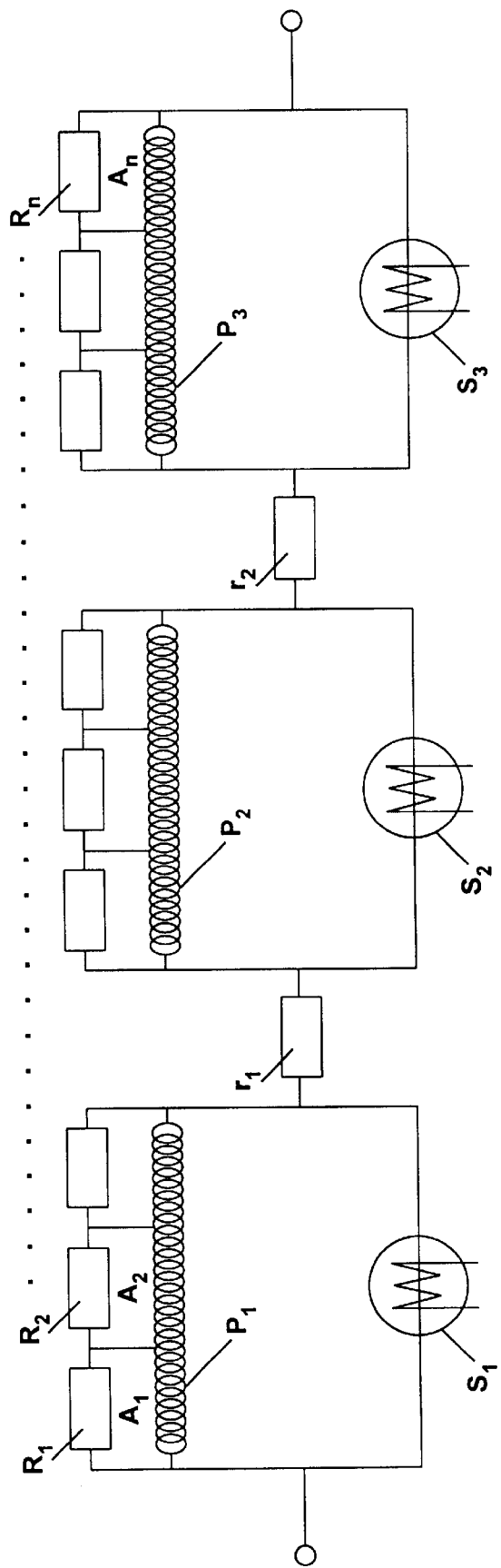
FIG. 2 shows a further embodiment having resistive connections of the closed superconducting current paths.

The inventive superconducting magnet arrangement can be realized by different wiring systems. FIGS. 1 through 3 show three concrete embodiments.

The embodiments provide three superconducting current paths $P_1, P_2, P_3$ which are in each case short-circuited via a superconducting switch $S_1, S_2, S_3$. The current paths $P_1, P_2, P_3$ are divided by ohmic resistors $R_1, R_2, \ldots R_n$ into n sections $A_1, A_2, \ldots A_n$ in that the respective ohmic resistor $R_i$ is connected in parallel with the corresponding section $A_i$.

In the embodiment according to FIG. 1 the superconductingly short-circuited current paths $P_1, P_2$ and $P_3$ and the associated superconducting switches $S_1, S_2$ and $S_3$ are connected in series and are connected to one another with superconducting wire.

As an alternative, and as shown in FIG. 2, the superconducting current paths $P_1, P_2, P_3$ can be connected in series with the associated switches $S_1, S_2, S_3$ but also resistively through normally conducting connection pieces $r_1, r_2$. It is to be pointed out that the normally conducting connection pieces $r_1, r_2$ in FIG. 2 are shown as equivalent resistors merely as differentiation from FIG. 1. In practice they will be realized in general not by resistors in the sense of electric components but through simple normally conducting wire, e.g. copper wire.

In the case of disturbance suppression with one or more compensation coils, the superconductingly short-circuited current paths $P_1, P_2, P_3$ may also be arranged in a galvanically separated manner as shown in FIG. 3.

What is claimed is:

1. Superconducting magnet arrangement with at least two current paths which are short-circuited during operation via superconducting switches, said current paths being able to carry different currents, wherein the magnet arrangement comprises at least one actively shielded superconducting magnet with a radially inner and a radially outer coil system carrying approximately the same current and having dipole moments of approximately the same magnitude, but opposite in direction, such that an external magnetic field disturbance in a working volume in the centre of the magnet arrangement is suppressed in long-term behavior to a remaining value of less than 20% of the external magnetic field disturbance, characterized in that sections of the current paths are bridged via ohmic resistors and that these sections and the ohmic resistors are chosen such that the magnetic field disturbance in the working volume is reduced immediately after its occurrence with respect to the remaining value in the long-term behaviour of less than 20% of the external magnetic field disturbance, and that subsequently, the magnetic field disturbance in the working volume approaches monotonously the remaining value of less than 20% of the external magnetic field shift with a time constant of $\tau \geq 2$ sec.

2. Magnet arrangement according to claim 1, characterized in that the magnet arrangement is part of an apparatus for high-resolution magnetic resonance spectroscopy.

3. Magnet arrangement according to claim 2, characterized in that the magnetic resonance apparatus comprises a means for field locking the magnetic field generated in the working volume, wherein the superconducting current paths are largely decoupled from the lock coils.

4. Magnet arrangement according to claim 2, characterized in that the magnetic resonance apparatus comprises sweep coils, wherein the superconducting current paths are largely decoupled from the sweep coils.

5. Magnet arrangement according to claim 1, characterized in that the ohmic resistors are arranged such that in case of a quench, with a breakdown or a partial breakdown of the superconductivity in the magnet arrangement, they take on the function of protective resistors for the protection of the magnet arrangement with respect to thermal and mechanical damages.

6. Magnet arrangement according to claim 1, characterized in that the sections, the ohmic resistors and the resistors of the open switches that are superconducting during operation, are dimensioned such that when applying a charging voltage to the magnet arrangement during the charging phase of the superconducting current paths, the current differences between neighbouring sections of the current paths are as small as possible.

7. Magnet arrangement according to claim 1, characterized in that the sections and/or the ohmic resistors and the superconducting current paths are dimensioned such that in case of occurrence of an external magnetic field disturbance, the homogeneity of the magnetic field generated by the magnet arrangement in the working volume, is largely maintained.

8. Magnet arrangement according to claim 1, characterized in that the radially inner coil system is connected in series with the radially outer coil system of the actively shielded magnet, wherein said serial connection forms a first current path which is superconductingly short-circuited during operation, and that one compensation coil which is galvanically not connected with the two coil systems is arranged coaxially to the two coil systems and forms a further current path which is superconductingly short-circuited during operation.

9. Magnet arrangement according to claim 1, characterized in that the radially inner coil system is connected in series with the radially outer coil system of the actively shielded magnet, wherein said serial connection forms a first current path superconductingly short-circuited during operation, and that part of the inner and/or outer coil system of the actively shielded magnet can be short-circuited via a further superconducting switch and thus forms a further current path superconductingly short-circuited during operation.

10. Magnet arrangement according to claim 1, characterized in that at least part of the current paths which are superconductingly short-circuited during operation, are connected in series with one another in a superconducting manner.

11. Magnet arrangement according to claim 1, characterized in that at least part of the current paths which are superconductingly short-circuited during operation, are connected with one another in a resistive manner and that each of the current paths comprises at least one superconducting switch.

12. Magnet arrangement according to claim 1, characterized in that at least part of the current paths which are superconductingly short-circuited during operation, are galvanically not connected.

13. Magnet arrangement according to claim 8, characterized in that at least at some points, where after charging of the superconducting magnet arrangement, there is no current flow in the initial state of operation, current limiters, preferably in the order of magnitude of a few amperes, and/or small ohmic resistors, preferably in the order of magnitude of $\mu\Omega$ to $m\Omega$ are inserted in the otherwise superconducting current paths.

14. Magnet arrangement according to claim 8, characterized in that at least one superconducting switch comprises a heater which is electrically connected in series with the heater of the superconducting switch of at least one further current path.

15. Magnet arrangement according to claim 14, characterized in that the heater of at least one superconducting switch can be heated via the serial connection with another switch heater as well as separately.

16. Magnet arrangement according to claim 1, characterized in that the current paths which are superconductingly short-circuited during operation are largely inductively decoupled from each other.

17. Magnet arrangement according to claim 16, characterized in that for the inductive decoupling, a different polarity of the radially inner and the radially outer coil system of the actively shielded magnet is utilized.

18. Magnet arrangement according to claim 1, characterized in that one or more of the current paths with closed superconducting loop comprise coils with various winding radii and/or various current densities, wherein said coils are coaxial with respect to the actively shielded magnet.

19. Magnet arrangement according to claim 1, characterized in that the sections and ohmic resistors are chosen such that compensation of the external magnetic field disturbance in the working volume to a remaining value of less than 10%, is effected over the entire time range.

20. Method for the calculation and optimization of a magnet arrangement according to claim 1, characterized in that the time evolution of the field strength of the magnetic field generated in the working volume is calculated after an external magnetic field disturbance in the form of a step function and optimized through variation of the arrangement of the sections bridged through the ohmic resistors, of the ohmic resistors and the geometrical arrangement of the current paths which are superconductingly short-circuited during operation.

21. Method according to claim 20, characterized in that also the time evolution of the second derivative of the magnetic field strength in the working volume with respect to the coordinate of the field direction is used for optimization with the aim of minimizing its variation with time after an external magnetic field disturbance in the form of a step function.

22. Magnet arrangement according to claim 9, characterized in that at least at some points, where after charging of the superconducting magnet arrangement, there is no current flow in the initial state of operation, current limiters, preferably in the order of magnitude of a few amperes, and/or small ohmic resistors, preferably in the order of magnitude of $\mu\Omega$ to m$\Omega$ are inserted in the otherwise superconducting current paths.

23. Magnet arrangement according to claim 9, characterized in that at least one superconducting switch comprises a heater which is electrically connected in series with the heater of the superconducting switch of at least one further current path.

24. Magnet arrangement according to claim 23, characterized in that the heater of at least one superconducting switch can be heated via the serial connection with another switch heater as well as separately.

25. Magnet arrangement according to claim 1, characterized in that the time constant is $\tau \geq 5$ sec.

26. Magnet arrangement according to claim 1, characterized in that the time constant is $\tau \approx 20$ sec.

27. Magnet arrangement according to claim 19, characterized in that compensation of the external magnetic field disturbance in the working volume is less than 5%.

28. Magnet arrangement according to claim 19, characterized in that compensation of the external magnetic field disturbance in the working volume is less than 2%.

* * * * *